(12) United States Patent
Park

(10) Patent No.: US 6,777,294 B2
(45) Date of Patent: Aug. 17, 2004

(54) METHOD OF FORMING A SELECT LINE IN A NAND TYPE FLASH MEMORY DEVICE

(75) Inventor: Byung Soo Park, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/616,715

(22) Filed: Jul. 10, 2003

(65) Prior Publication Data

US 2004/0014286 A1 Jan. 22, 2004

(30) Foreign Application Priority Data

Jul. 11, 2002 (KR) ................................ 10-2002-0040466

(51) Int. Cl.[7] ......................................... H01L 21/8247
(52) U.S. Cl. ...................................... 438/264; 438/637
(58) Field of Search ............................... 438/257–267, 438/637, 672

(56) References Cited

U.S. PATENT DOCUMENTS

| | | | | |
|---|---|---|---|---|
| 6,567,308 B2 | * | 5/2003 | Yim et al. | 365/185.17 |
| 2001/0001491 A1 | * | 5/2001 | Sakui | 257/316 |
| 2001/0019163 A1 | * | 9/2001 | Fournel et al. | 257/391 |
| 2001/0019867 A1 | * | 9/2001 | Kawata et al. | 438/257 |
| 2002/0098651 A1 | * | 7/2002 | Yim et al. | 438/258 |
| 2002/0146884 A1 | * | 10/2002 | Kawata et al. | 438/257 |

* cited by examiner

Primary Examiner—Richard A. Booth
(74) Attorney, Agent, or Firm—Marshall, Gerstein & Borun LLP

(57) ABSTRACT

A method of forming a select line in a NAND type flash memory device is disclosed. In the select line having a stack structure of the floating gate, the dielectric film and the control gate, the control gate is patterned so that a first projection is formed at the edge of the control gate, and the floating gate is formed by means of the self-aligned etch process. At this time, the floating gate is patterned so that a second projection the one end of which overlaps the first projection is formed at the edge of the floating gate. Next, the first and second projections are electrically connected using the contact plugs and the metal line, whereby a voltage is simultaneously applied to the control gate of a low resistance and the floating gate of a high resistance. Therefore, the present invention can minimize generation of voltage drop to improve electrical characteristics, and obviate a process of removing the dielectric film for electrically connecting the floating gate and the control gate to simplify the process steps.

11 Claims, 7 Drawing Sheets

METHOD OF FORMING A SELECT LINE IN A NAND TYPE FLASH MEMORY DEVICE

BACKGROUND OF THE INVENTION

1. Field of the Invention

The present invention relates to a method of forming a select line in a NAND type flash memory device, and more particularly, to a method of forming a select line in a NAND type flash memory device capable of preventing degradation in electrical characteristics due to voltage drop when the bias is applied to a polysilicon layer for a floating gate having a high resistance, in the select transistors having the same structure to the flash memory cells.

2. Background of the Related Art

A NAND type flash memory of a stack structure operates in a block unit. At this time, the blocks are divided and selected, using the select transistor.

FIG. 1 is a layout view of a conventional NAND type flash memory array, FIG. 2 is a cross-sectional view of the memory array taken along lines A–A' in FIG. 1, and FIG. 3 is a cross-sectional view of the memory array taken along lines B–B' in FIG. 1.

Referring to FIG. 1, FIG. 2 and FIG. 3, device isolation films 102 are formed at the semiconductor substrate 101 to define a plurality of active regions ACT that are parallel one another. Further, drain select lines DSL0, DSL1, . . . , first~$n^{th}$ word lines WL1~WLn and source select lines SSL1, SSL2, . . . are formed vertically to the active region ACT on the semiconductor substrate 101. The lines have a stack structure of a tunnel oxide film 103, a floating gate 104, a dielectric film 105 and a control gate 106. The control gate 106 has a stack structure of a polysilicon layer and a silicide layer. Meanwhile, impurity regions 107d, 107 and 107c are formed at the active region ACT between the drain select lines DSL0, DSL1, . . . , the first~$n^{th}$ word lines WL1~WLn and the source select lines SSL1, SSL2, . . . . At this time, the impurity region 107d formed at the edge of the drain select line DSL1 on the opposite side of the first word line WL1 serves as the drain. The impurity region 107c formed at the edge of the source select line SSL1 on the opposite side of the $n^{th}$ word line WLn functions as the source.

Meanwhile, a drain select transistor Td is formed at a region where the drain select line DSL1 and the active regions ACT intersect. A ground select transistor Ts is formed at a region where the source select line SSL1 and the active regions ACT intersect. Likewise, flash memory cells Cell1~Celln are formed at a region where the first~$n^{th}$ word lines WL1~WLn and the active regions ACT intersect. At this time, the active region ACT is isolated by the isolation film 102. However, in order to easily connect the active regions ACT between the ground select transistors Ts using the ground terminals, the active regions ACT may be formed so that the active regions ACT between the ground select transistors Ts may be connected (it is shown in the drawing that they are isolated one another). Thereby, a block B100 having the drain select transistor Td, a plurality of flash memory cells Cell1~Celln and a ground select transistor Ts, all of which are serially connected to the active region ACT, is formed on the semiconductor substrate 101.

In the above, the floating gates 103 of the flash memory cells Cell1~Celln are isolated one another on the device isolation region by means of the floating gate isolation FGI pattern. However, the drain select lines DSL0, DSL1, . . . and the ground select lines SSL1, SSL2, . . . are not isolated even on the device isolation film 102 but all the layers 102~106 are consecutively connected, as shown in FIG. 3.

At this time, as the drain select transistor Td and the source select transistor Ts are formed to have the structure of the flash memory cell, it is required that a high voltage be applied to the select line DSL or SSL or the floating gate in order to obtain the normal transistor operation, or the dielectric films 105 between the control gate 106 and the floating gate 104 in the drain select lines DSL0, DSL1, . . . and the source select lines SSL1, SSL2, . . . be removed.

In this case, abrupt voltage drop occurs due to high resistance of the floating gate. Further, as the degree of integration in the device becomes higher, it is difficult to remove the process margin for removing the dielectric films 105 between the control gate 106 and the floating gate 104 in the drain select lines DSL0, DSL1, . . . and the source select lines SSL1, SSL2, . . . . Due to this, there is a disadvantage that the degree of difficulty in the entire processes becomes higher.

SUMMARY OF THE INVENTION

Accordingly, the present invention is contrived to substantially obviate one or more problems due to limitations and disadvantages of the related art, and an object of the present invention is to provide a method of forming a select line in a NAND type flash memory device capable of improving electrical characteristics by minimizing generation of voltage drop, and simplifying the process steps by obviating the process of removing the dielectric film for electrically connecting the floating gate and the control gate.

In order to accomplish the above object, in the select line having the stack structure of the floating gate, the dielectric film and the control gate, the control gate is patterned so that a first projection is formed at the edge of the control gate and the floating gate is formed by means of the self-aligned etch process. At this time, the floating gate is patterned so that a second projection the one end of which overlaps the first projection is formed at the edge of the floating gate. The first and second projections are then electrically connected using the contact plugs and the metal line, whereby a voltage is simultaneously applied to the control gate of a low resistance and the floating gate of a high resistance.

In a preferred embodiment, a method of forming the select line of NAND type flash memory devices according to the present invention is characterized in that it comprises the steps of sequentially forming a tunnel oxide film and a first polysilicon layer on a semiconductor substrate in which an isolation film is formed, and then performing a first patterning process in the direction of bit lines, forming a dielectric film, a second polysilicon layer and a silicide layer on the entire structure, performing a second patterning process for the silicide layer and the second polysilicon layer so that the first projection is formed at the edge of the silicide layer and the second polysilicon layer on the device isolation region between drain select line regions, performing a third patterning process for the dielectric film and the first polysilicon layer to form drain select lines so that a second projection the one end of which overlaps the first projection is formed at the edge of the first polysilicon layer on the device isolation region between the drain select lines, forming an interlayer insulating film on the entire structure and then forming a contact hole through which the first and second projections are opened, and burying the contact hole with a conductive material to form contact plugs and also forming a metal line connecting the contact plugs formed on the first and second projections on the interlayer insulating film.

In the above, during the second patterning process, in the cell region, the silicide layer and the second polysilicon layer are patterned in order to form word lines.

The third patterning process is performed with the etch mask formed on the second projection so that the second projection is formed at the edge of the first polysilicon layer. During the third patterning process, in the cell region, a self-aligned etch process is performed in order to form the word lines, so that the dielectric film and the first polysilicon layer are patterned.

The method further comprises the step of forming insulating film spacers at the sidewalls of the drain select lines, before the interlayer insulating film is formed after the third patterning process.

Upon formation of the contact hole and the contact plug, the contact hole and the contact plugs for connecting the bit line and the active region are formed even at the active region of the cell region.

In another preferred embodiment, a method of forming a select line of NAND type flash memory devices according to the present invention is characterized in that it comprises the steps of sequentially forming a tunnel oxide film and a first polysilicon layer on a semiconductor substrate in which an isolation film is formed, and then performing a first patterning process in the direction of bit lines, forming a dielectric film, a second polysilicon layer and a silicide layer on the entire structure, performing a second patterning process for the silicide layer and the second polysilicon layer by means of an etch process using a control gate mask, forming an interlayer insulating film on the entire structure and then forming a contact hole through which a given portion of the first and second polysilicon layer is opened, and burying the contact hole with a conductive material to form contact plugs and also forming a metal line connecting the contact plugs formed on the first and second projections on the interlayer insulating film.

In the above, during the second patterning process, in the cell region, the silicide layer and the second polysilicon layer are patterned in order to form word lines.

The method further comprises the step of performing a third patterning process for the dielectric film and the first polysilicon layer in the cell region by means of the self-aligned etch process, before the interlayer insulating film is formed after the second patterning process. The method further comprises the step of forming insulating film spacers at the sidewalls of the source select line, before the interlayer insulating film: is formed after the second patterning process.

Upon formation of the contact hole and the contact plug, the contact hole and the contact plugs for connecting the bit line and the active region are formed even at the active region of the cell region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
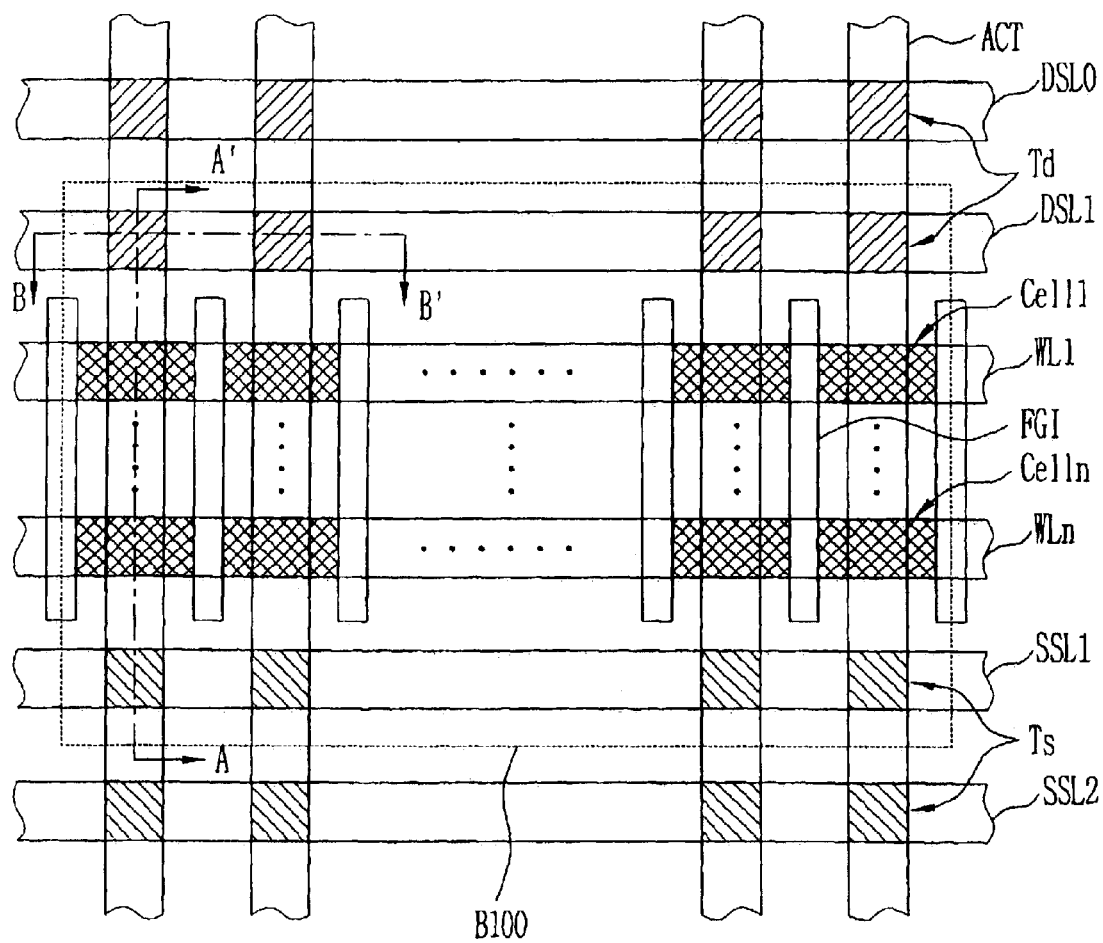
FIG. 1 is a layout view of a conventional NAND type flash memory array.
Figure 2:
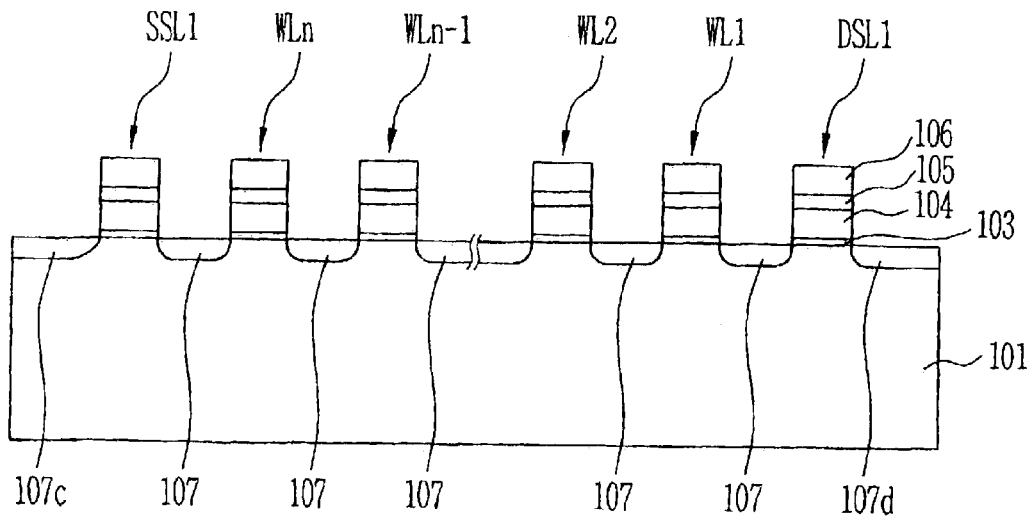
FIG. 2 is a cross-sectional view of the memory array taken along lines A–A' in FIG. 1.
Figure 3:
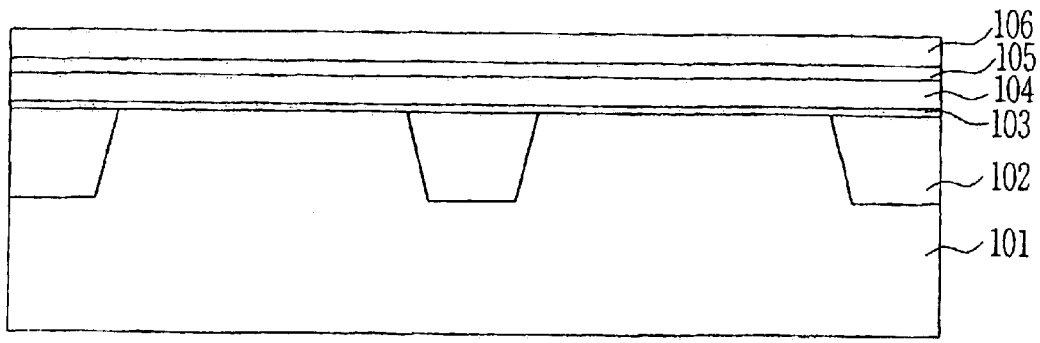
FIG. 3 is a cross-sectional view of the memory array taken along lines B–B' in FIG. 1.

Reference will now be made in detail to the preferred embodiments of the present invention, examples of which are illustrated in the accompanying drawings, in which like reference numerals are used to identify the same or similar parts.

Figure 4:
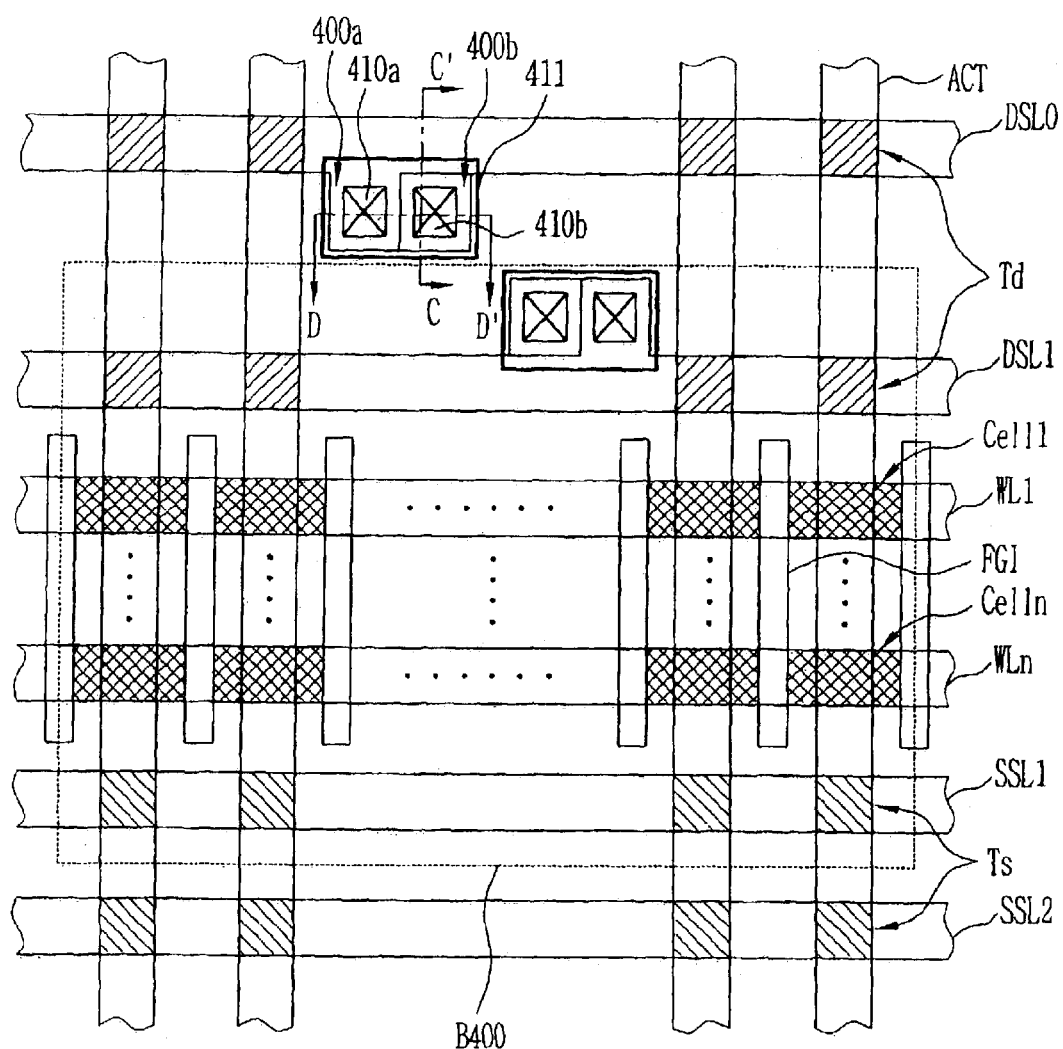
FIG. 4 is a layout view of a NAND type flash memory array according to the present invention.

FIG. 4 is a layout view of a NAND type flash memory array according to the present invention.

Referring to FIG. 4, the NAND type flash memory block B400 of the present invention comprises drain select lines DSL0, DSL1, . . . , first~$n^{th}$ word lines WL1~WLn and source select lines SSL1, SSL2, . . . , all of which are formed vertically to an active region ACT; impurity regions formed at the active region ACT between the drain select lines DSL0, DSL1, . . . , the first~$n^{th}$ word lines WL1~WLn and the source select lines SSL1, SSL2, . . . ; a drain select transistor Td formed at a region where the drain select line DSL1 and the active region ACT intersect; a ground select transistor Ts formed at a region where the source select line SSL1 and the active region ACT intersect; and flash memory cells Cell1~Celln formed at a region where the first~$n^{th}$ word lines WL1~WLn and the active regions ACT intersect.

At this time, in the drain select lines DSL0, DSL1, . . . , the control gates and the floating gates of the drain select lines DSL0, DSL1, . . . are electrically connected by first and second contact plugs 410a and 410b and a metal line 411.

Explaining in more detail, in the drain select lines DSL0, DSL1, . . . having a stack structure of the floating gate, the dielectric film and the control gate, the control gate is patterned so that a first projection 400a is formed at the edge of the control gate, and the floating gate is formed by means of the self-aligned etch process. At this time, the floating gate is patterned so that a second projection 400b the one end of which overlaps the first projection 400a is formed at the edge of the floating gate. Next, the first and second projections 400a and 400b are electrically connected using the contact plugs 410a and 410b and the metal line 411, whereby the voltage applied to the drain select lines DSL0, DSL1, . . . is simultaneously applied to the control gate of a low resistance and the floating gate of a high resistance.

Hereinafter, a method of forming the select lines according to the present invention will be described by reference to FIG. 5A~FIG. 5F and FIG. 6A~FIG. 6F.

FIG. 5A~FIG. 5F are cross-sectional views of the memory arrays taken along lines C–C' in FIG. 4 and FIG.

Figure 6A:
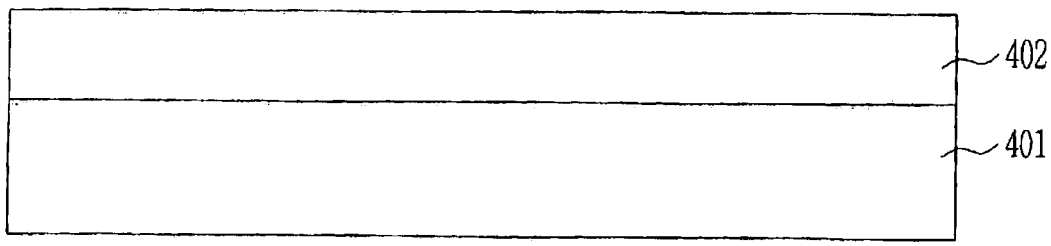
FIG. 6A~FIG. 6F are cross-sectional views of the memory arrays taken along lines D–D' in FIG. 4.
Figure 6B:
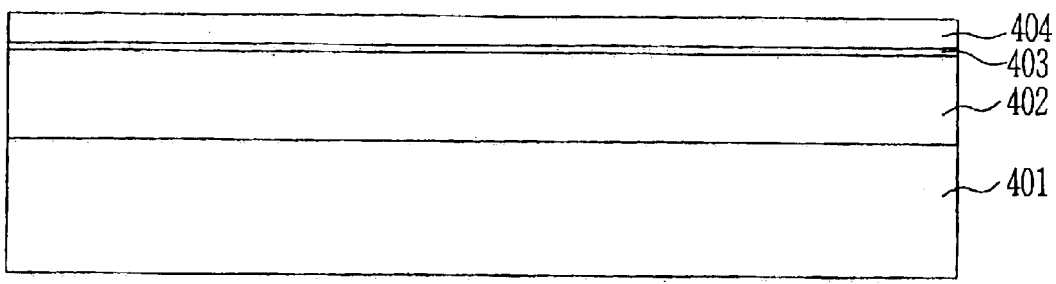
Figure 6C:
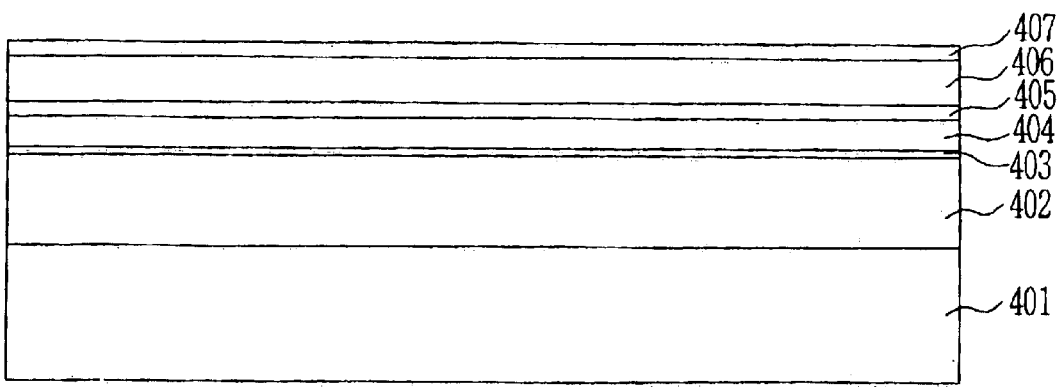
Figure 6D:
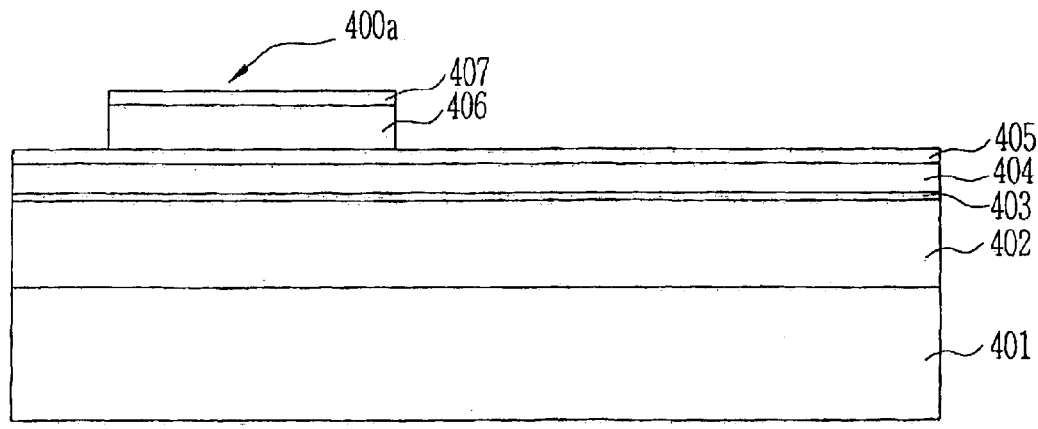
Figure 6E:
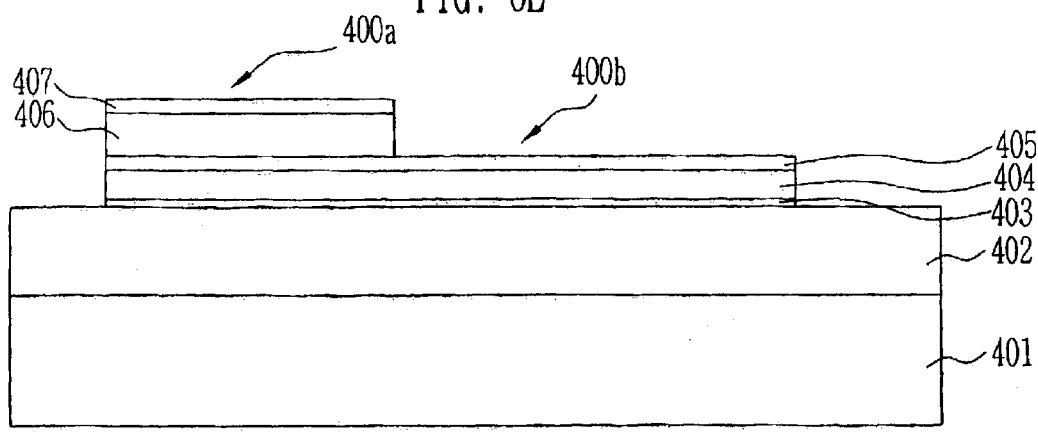
Figure 6F:
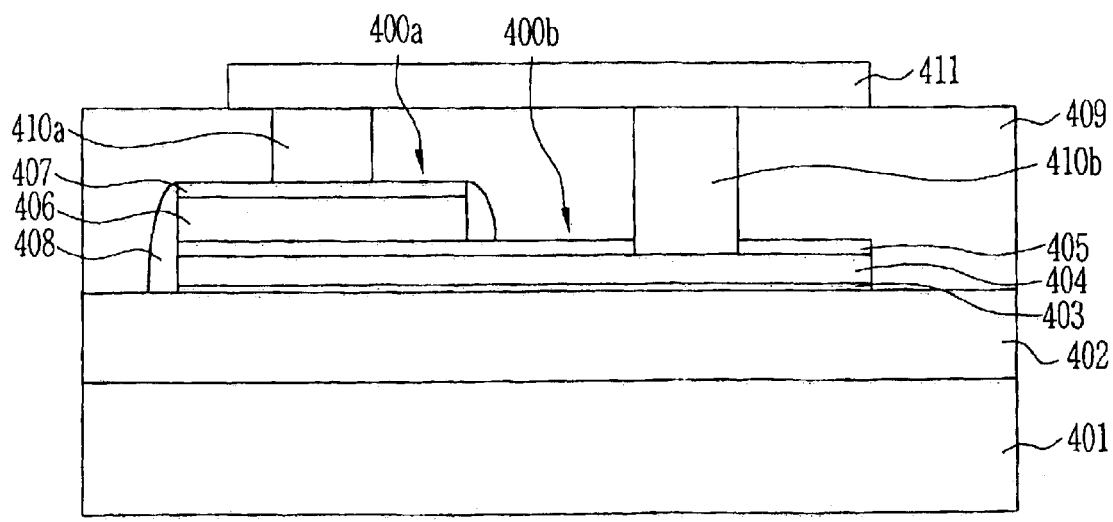

6A~FIG. 6F are cross-sectional views of the memory arrays taken along lines D–D' in FIG. 4.

Figure 5A:
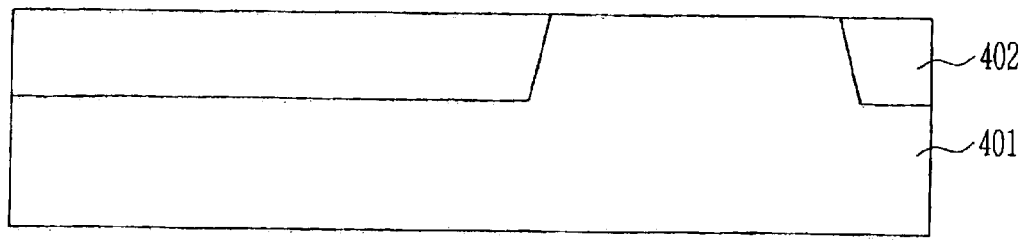
FIG. 5A~FIG. 5F are cross-sectional views of the memory arrays taken along lines C–C' in FIG. 4.

Referring now to FIG. 4, FIG. 5A and FIG. 6A, an isolation film 402 is formed at a given isolation region of the semiconductor substrate 401 to define the active region ACT in which the device will be formed.

Figure 5B:
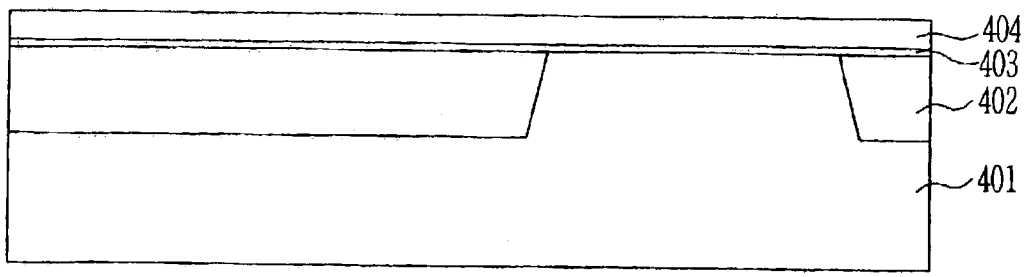

By reference to FIG. 4, FIG. 5B and FIG. 6B, a tunnel oxide film 403 and a first polysilicon layer 404 for the floating gate are sequentially formed on the entire structure. Next, though not shown in the drawings, the first polysilicon layer 404 and the tunnel oxide film 403 are patterned in a direction vertical to the word line by means of a first patterning process for forming the floating gate so that the first polysilicon layer 404 and the tunnel oxide film 403 are isolated on the isolation film 402.

Figure 5C:
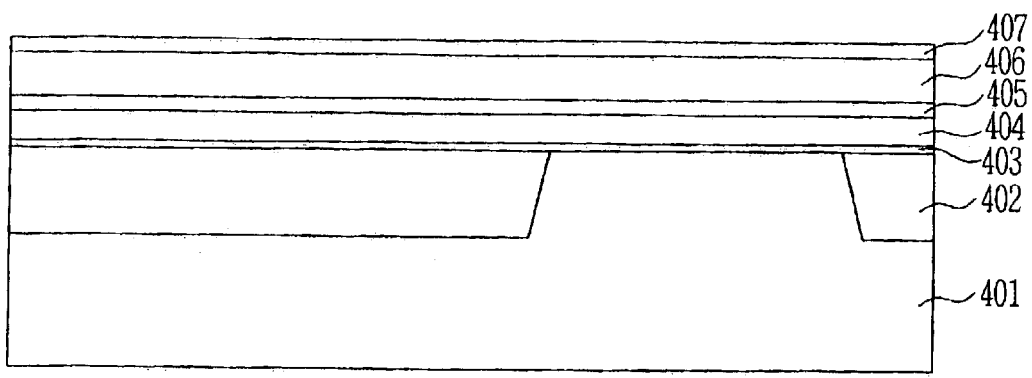

Referring next to FIG. 4, FIG. 5C and FIG. 6C, a dielectric film 405, a second polysilicon layer 406 for the control gate and a silicide layer 407 are sequentially formed on the entire structure.

Figure 5D:
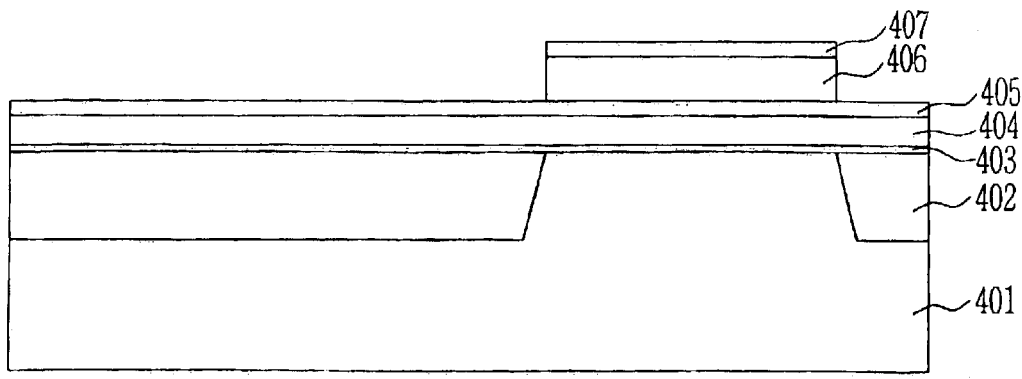

By reference to FIG. 4, FIG. 5D and FIG. 6D, the silicide layer 407 and the second polysilicon layer 406 are patterned by means of the etch process using the control gate mask. At this time, the silicide layer 407 and the second polysilicon layer 406 are patterned so that the first projection 400a is formed at the edges of the silicide layer 407 and the second polysilicon layer 406 on the device isolation region between the two drain select lines DSL0 and DSL1. Further, it should be understood that the etch process may be performed after the hard mask (not shown) and an anti-reflecting film (not shown) are formed on the silicide layer 407 in order to improve patterning characteristics.

Meanwhile, the silicide layer 407 and the second polysilicon layer 406 are patterned by means of the etch process using the dielectric film 405 as an etch stop layer. At this time, it should be noted that the dielectric film 405 might be additionally patterned after the silicide layer 407 and the second polysilicon layer 406 are patterned.

Figure 5E:
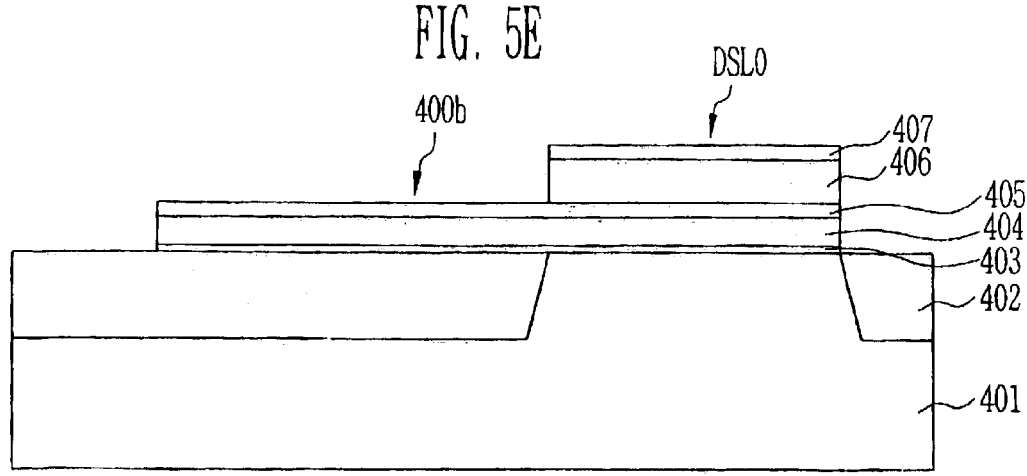

Referring now to FIG. 4, FIG. 5E and FIG. 6E, the dielectric film 405 and the first polysilicon layer 404 are patterned by the self-aligned etch (SAE) process. At this time, the etch mask (not shown) is formed so that the second projection 400b the one end of which overlaps the first projection 400a is formed at the edge of the first polysilicon layer 404 on the device isolation region between the two drain select lines DSL0 and DSL1. Next, the dielectric film 405 and the first polysilicon layer 404 are patterned.

Thereby, the first projection 400a is formed at the edge of the silicide layer 407 and the second polysilicon layer 406. Also, the drain select lines DSL0, DSL1, . . . where the second projection 400b the one end of which overlaps the first projection 400a is formed, is formed at the edge of the first polysilicon layer 404. Further, the drain select transistor Td is formed at a region where the drain select lines DSL0, DSL1, . . . and the active region ACT overlap. Meanwhile, while the word lines WL1~WLn on which the tunnel oxide film, the floating gate consisting of the first polysilicon layer, the dielectric film, and the control gate consisting of the second polysilicon layer and the silicide layer are stacked is formed in the cell region, the flash memory cells Cell1~Celln are formed at the region where the word lines WL1~WLn and the active region ACT overlap.

Hereinafter, though not shown in the drawings, the ion implantation process is implemented to form an impurity region at the active region ACT between the drain select lines DSL0, DSL1, . . . , the word lines WL1~WLn and the source select lines SSL1, SSL2, . . . . The impurity region serves as the drain of the drain select transistor Td or the source of the source select transistor Ts.

Figure 5F:
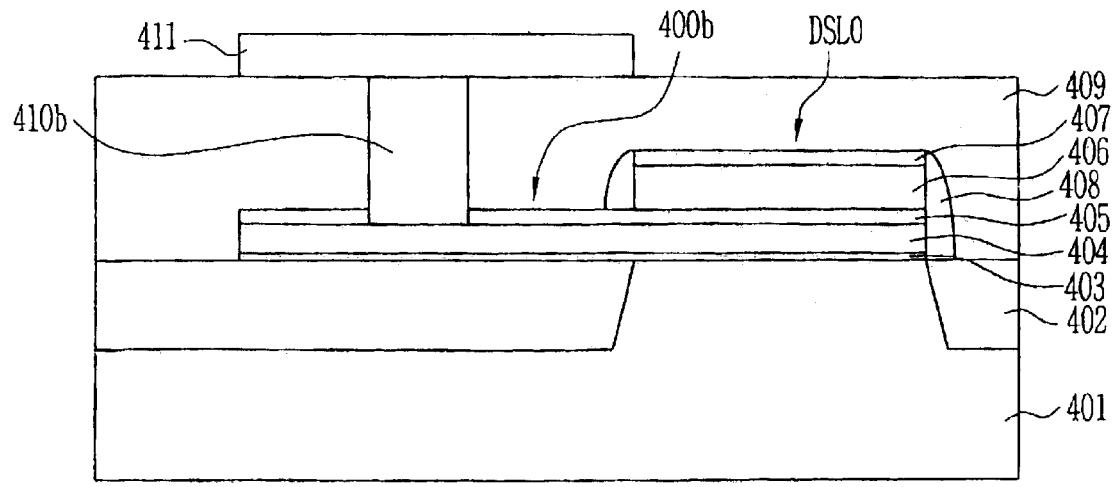

Referring to FIG. 4, FIG. 5F and FIG. 6F, an insulating film spacer 408 is formed at the side wall of each of the lines DSL0, DSL1, . . . and WL1~WLn, SSL1, SSL2, . . . . An interlayer insulating film 409 is then formed on the entire structure. Next, the contact hole is formed through which a given portion of the active region and the first and second projections 400a and 400b are opened. At this time, the contact hole (not shown) through the given portion of the active region ACT is opened, is formed to electrically connect the active region and the bit line (not shown). Further, the contact hole through which the first and second projections 400a and 400b are opened, is formed to electrically connect the first and second projections 400a and 400b.

After the contact hole is formed, the contact hole is buried with a conductive material, thus forming contact plugs 410a and 410b. Thereafter, when the metal layer formation process and the patterning process are performed in order to form the bit line (for convenience, not shown) on the interlayer insulating film 409, a metal line 411 for connecting the first and second contact plugs 410a and 410b is simultaneously formed so that the first contact plug 410a formed on the first projection 400a and the second contact plug 410b formed on the second projection 400b are electrically connected.

Thereby, the first projection 400a of the silicide layer 407 and the second polysilicon layer 406, and the second projection 400b of the first polysilicon layer 404 are electrically connected through the first and second contact plugs 410a and 410b and the metal line 411. In other words, the control gate and the floating gate of the drain select lines DSL0, DSL1, . . . are electrically connected through the first and second projections 400a and 400b, the first and second contact plugs 410a and 410b, and the metal line 411. Thereby, as the voltage applied to the drain select lines DSL0, DSL1, . . . is simultaneously applied to the control gate of a low resistance and the floating gate of a high resistance, generation of voltage drop is minimized while the drain select transistor Td can be normally operated.

Meanwhile, it should be understood that the source select lines SSL1, SSL2, . . . may be formed using the method of forming the drain select lines DSL0, DSL1, . . . (not shown). At this time, as it is required that the drain select lines DSL0, DSL1, . . . be independently operated, the first polysilicon layers being the floating gate must be isolated one another. On the contrary, as it does not matter that the source select lines SSL1, SSL2, . . . are simultaneously operated, the floating gate is not formed so that the projection is formed at the edge of the floating gates of the source select lines SSL1 and SSL2. Instead, the source select lines SSL1 and SSL2 may be formed so that the floating gates of neighboring source select lines SSL1 and SSL2 are connected one another. Also, the projection is not formed even at the control gates of the source select lines SSL1 and SSL2. Instead, after each of the contact plugs is formed on the control gate and the floating gate remained between the source select lines SSL1 and SSL2, the metal line may be formed so that the control gate and the floating gate are electrically connected. Still more, the metal line may be formed so that the control gates are connected one another.

As mentioned above, according to the present invention, the projections are formed at the floating gate and the control gate of the select line, respectively and the projections are connected using the contact plugs and the metal line, whereby that the floating gate of a high resistance and the control gate of a low resistance are electrically connected. As such, the voltage applied to the select line is simultaneously applied to the control gate and the floating gate. Therefore, the present invention has advantageous effects that it can reduce voltage drop, obviate the process of removing the dielectric film for electrically connecting the floating gate and the control gate, improve electrical characteristics of the devices and simplify the process steps.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming a select line in a NAND type flash memory device, comprising the steps of:
    sequentially forming a tunnel oxide film and a first polysilicon layer on a semiconductor substrate in which an isolation film is formed, and then performing a first patterning process in the direction of bit lines;
    forming a dielectric film, a second polysilicon layer and a silicide layer on the entire structure;
    performing a second patterning process for the silicide layer and the second polysilicon layer so that a first projection is formed at the edge of the silicide layer and the second polysilicon layer on the device isolation region between drain select line regions;
    performing a third patterning process for the dielectric film and the first polysilicon layer to form drain select lines so that a second projection the one end of which overlaps the first projection is formed at the edge of the first polysilicon layer on the device isolation region between the drain select lines regions;
    forming an interlayer insulating film on the entire structure and then forming a contact hole through which the first and second projections are opened; and
    burying the contact hole with a conductive material to form contact plugs and also forming a metal line connecting the contact plugs formed on the first and second projections on the interlayer insulating film.

2. The method as claimed in claim 1, wherein during the second patterning process, in the cell region, the silicide layer and the second polysilicon layer are patterned in order to form word lines.

3. The method as claimed in claim 1, wherein the third patterning process is performed with the etch mask formed on the second projection so that the second projection is formed at the edge of the first polysilicon layer.

4. The method as claimed in claim 1, wherein during the third patterning process, in the cell region, a self-aligned etch process is performed in order to form the word lines, whereby the dielectric film and the first polysilicon layer are patterned.

5. The method as claimed in claim 1, further comprising the step of forming insulating film spacers at the sidewalls of the drain select lines, before the interlayer insulating film is formed after the third patterning process.

6. The method as claimed in claim 1, wherein upon formation of the contact hole and the contact plug, the contact hole and the contact plugs for connecting the bit line and the active region are formed even at the active region of the cell region.

7. A method of forming a select line in a NAND type flash memory device, comprising the steps of:
    sequentially forming a tunnel oxide film and a first polysilicon layer on a semiconductor substrate in which an isolation film is formed, and then performing a first patterning process in the direction of bit lines;
    forming a dielectric film, a second polysilicon layer and a silicide layer on the entire structure;
    performing a second patterning process for the silicide layer and the second polysilicon layer by means of an etch process using a control gate mask;
    forming an interlayer insulating film on the entire structure and then forming contact holes through which a given portion of the first and second polysilicon layer is exposed; and
    burying the contact hole with a conductive material to form contact plugs and also forming a metal line connecting the contact plugs formed in the first and second contact holes in the interlayer insulating film.

8. The method as claimed in claim 7, wherein during the second patterning process, in the cell region, the silicide layer and the second polysilicon layer are patterned in order to form word lines.

9. The method as claimed in claim 7, further comprising the step of performing a third patterning process for the dielectric film and the first polysilicon layer in the cell region by means of the self-aligned etch process, before the interlayer insulating film is formed after the second patterning process.

10. The method as claimed in claim 7, further comprising the step of forming insulating film spacers at the sidewalls of the source select line, before the interlayer insulating film is formed after the second patterning process.

11. The method as claimed in claim 7, wherein upon formation of the contact hole and the contact plug, the contact hole and the contact plugs for connecting the bit line and the active region are formed even at the active region of the cell region.

* * * * *